United States Patent [19]

Nazzaro et al.

[11] Patent Number: 5,260,166
[45] Date of Patent: Nov. 9, 1993

[54] SEAMLESS, TRILAMINATE, PHOTOPOLYMER CYLINDRICAL PRINTING PLATE AND METHOD OF MANUFACTURE

[75] Inventors: Alfonso C. Nazzaro, Rochester; Daniel P. Fallin, Tonawanda, both of N.Y.

[73] Assignee: Graphic Controls Corporation, Buffalo, N.Y.

[21] Appl. No.: 845,636

[22] Filed: Mar. 4, 1992

[51] Int. Cl.$^5$ ............................................. G03C 1/492
[52] U.S. Cl. .................................... 430/271; 430/270; 430/273; 430/280; 430/306
[58] Field of Search ............... 430/271, 273, 270, 280, 430/306

[56] References Cited

U.S. PATENT DOCUMENTS

| | | | |
|---|---|---|---|
| 3,081,168 | 3/1963 | Leekley et al. | 96/35 |
| 3,512,971 | 5/1970 | Floss et al. | 96/35.1 |
| 3,516,828 | 6/1970 | Floss et al. | 96/35.1 |
| 3,836,709 | 9/1974 | Hutchison | 430/306 |
| 3,978,254 | 8/1976 | Hoexter et al. | 428/36 |
| 4,144,073 | 3/1979 | Bronstert et al. | 96/115 P |
| 4,269,930 | 5/1981 | Kress | 430/270 |
| 4,298,680 | 11/1981 | Bruno | 430/300 |
| 4,381,961 | 5/1983 | van der Velden | 156/215 |
| 4,389,116 | 6/1983 | Vogel | 355/85 |
| 4,391,898 | 7/1983 | van der Velden | 430/306 |
| 4,446,222 | 5/1984 | Kress | 430/307 |
| 4,478,931 | 10/1984 | Fickes et al. | 430/309 |
| 4,554,040 | 11/1985 | van der Velden | 156/285 |
| 4,554,040 | 11/1985 | van der Velden | 430/306 X |
| 4,642,283 | 2/1987 | Takahashi et al. | 430/303 |
| 4,643,963 | 2/1987 | Hartmann et al. | 430/286 |
| 4,868,090 | 9/1989 | Kitamura et al. | 430/271 |
| 4,869,997 | 9/1989 | Koch et al. | 430/300 |
| 4,871,650 | 10/1989 | Wallbillich et al. | 430/300 |
| 4,903,597 | 2/1990 | Hoage et al. | 101/401.1 |
| 4,906,551 | 3/1990 | Herrmann | 430/309 |
| 4,985,301 | 1/1991 | Butters et al. | 428/336 |
| 5,006,447 | 4/1991 | Umeda et al. | 430/272 |

*Primary Examiner*—Marion E. McCamish
*Assistant Examiner*—Mark A. Chapman
*Attorney, Agent, or Firm*—Ratner & Prestia

[57] ABSTRACT

A seamless, trilaminate, photopolymer cylindrical printing plate useful in a variety of printing processes, including the flexographic, letter press, dry-offset, intaglio, and gravure processes, capable of millions of printing runs with minimal degradation. The seamless, photopolymer, cylindrical printing plate has a seamless trilaminate cylindrical sleeve with a constant cross-sectional diameter and a longitudinal axis, a clear matte sealant layer completely covering the seamless trilaminate cylindrical sleeve, a bonder layer completely covering the clear matte sealant layer, and a photopolymer layer completely covering the bonder layer. A pigmented primer layer may completely cover the matte sealant layer and be completely covered by the bonder layer. A hardening layer and an anti-oxidant layer may completely cover the photopolymer layer. A method of manufacturing the seamless, trilaminate, photopolymer cylindrical printing plate is also provided. The wall thickness of the seamless, trilaminate, photopolymer cylindrical printing plate can be varied as desired to achieve different cylindrical repeat sizes, especially by controlling the thickness of the seamless trilaminate cylindrical sleeve, the thickness of the photopolymer layer, or both thicknesses.

25 Claims, 2 Drawing Sheets

SEAMLESS, TRILAMINATE, PHOTOPOLYMER CYLINDRICAL PRINTING PLATE AND METHOD OF MANUFACTURE

FIELD OF THE INVENTION

This invention relates generally to cylindrical printing plates used in a variety of printing processes (such as flexographic, letter press, dry-offset, intaglio, gravure, and the like) and, more particularly, to an improved seamless, photopolymer, cylindrical printing plate capable of large printing runs with minimal degradation and to a method of manufacturing such an improved seamless, trilaminate, photopolymer, cylindrical printing plate. The wall thickness of the improved printing plate can be varied as desired.

BACKGROUND OF THE INVENTION

The printing industry uses a variety of processes, including flexographic, letter press, dry-offset, intaglio, gravure, and the like, to print multiple ink images (often millions of copies) from a single, cylindrical printing plate onto a printing medium. In the printing operation, the somewhat flexible cylindrical printing plate is mounted onto the outer surface of a printing cylinder. The cylindrical printing plate can be mounted onto and removed from the printing cylinder so that a single printing cylinder can perform multiple jobs.

One type of cylindrical printing plate is formed of helically wound polyester. Wound cylindrical printing plates are expanded slightly by air pressure radially applied through holes in the external surface of the printing cylinder to axially mount the plates on, and to remove them from, the printing cylinder. Such "wound" cylindrical printing plates encounter, however, a number of problems. They cannot be expanded effectively unless production facilities purchase auxiliary sources of compressed air. Leakage problems are inherent in the design of wound cylindrical printing plates. Finally, wound cylindrical printing plates provide minimal structural integrity and exhibit minimal strength and durability.

Another type of cylindrical printing plate is made of metal, typically nickel, and may have a photopolymer coated on the metal surface. Air-mount cylinders also may be used to mount and remove such metal cylindrical printing plates. As in the case of wound cylindrical printing plates, metallic cylindrical printing plates are readily expandable but they must have thin walls (typically about 0.005 inches) to expand sufficiently for proper mounting on and removal from the printing cylinder. The required thin wall thicknesses create problems. For example, metallic cylindrical printing plates lack durability and are readily damaged. They easily form kinks in their outer surface when stored without the support of a printing cylinder. The metallic cylindrical printing plates also are limited in the wall thicknesses which they can achieve by electroplating and the metal must often be machined to obtain a variety of wall thicknesses. Finally, metal surfaces tend to add expense.

Dimensional stability is a problem in printing applications which require that the outer surface of the cylindrical printing plate have a truly round shape. In some printing applications, the true cylindrical shape must be within 0.001–0.005 inches tolerance level. The outer printing surface in such applications must accurately conform to a uniformly constant, cylindrical shape to imprint accurately a print image onto a printing medium. Whether wound or metal, conventional cylindrical printing plates often fail to meet these requisite tolerance levels.

A third type of cylindrical printing plate, a photopolymer cylindrical printing plate, is widely used in the printing industry because it has many advantages over wound and metallic cylindrical printing plates. Specifically, photopolymer cylindrical printing plates of a desired wall thickness can be both air mounted and used with conventional hydraulic or mechanical press cylinders. The photopolymer materials provide a fixed internal diameter and a variable outside diameter because a predetermined amount of material can be coated on the cylindrical sleeve during the manufacturing process. Dimensional stability is excellent and leakage problems are avoided. Photopolymer materials also provide strong and durable surfaces having structural integrity.

In medical, industrial, and other unique graphic arts fields, the printing images are continuous; the image areas of the printed matter neither has nor contains a gap. If a sheet or wrapped-butted photopolymer cylindrical printing plate is used, however, a discontinuity or gap will be produced in the image area of the printed matter. Consequently, photopolymer cylindrical printing plates are preferably unitary structures having substantially seamless inner and outer cylindrically shaped wall surfaces.

Even seamless photopolymer cylindrical printing plates suffer, however, from certain disadvantages, including softness and susceptibility to attack by organic solvents. Such disadvantages may make conventional photopolymer cylindrical printing plates unsuited for printing applications which involve mechanical stress, surface wear, or inks having solvents or abrasive components. In intaglio or gravure printing, for example, doctor blades wear against the print surface, the inks have strong solvents, and the printing process requires high speeds and long runs.

Therefore, to overcome the shortcomings of existing cylindrical printing plates, a new, seamless, trilaminate, photopolymer cylindrical printing plate is provided which is capable of large printing runs at high speeds with minimal degradation-.even when inks having strong solvents are used. A method of manufacturing such an improved printing plate is also provided.

SUMMARY OF THE INVENTION

The improved seamless, trilaminate, photopolymer, cylindrical printing plate of the present invention is useful in a variety of printing processes, including the flexographic, letter press, dry-offset, intaglio, and gravure processes, and is capable of millions of printing runs with minimal degradation. The subject printing plate has a seamless trilaminate cylindrical sleeve with a constant cross-sectional diameter and a longitudinal axis, a clear matte sealant layer completely covering the seamless trilaminate cylindrical sleeve, a bonder layer completely covering the clear matte sealant layer, and a photopolymer layer completely covering the bonder layer. A pigmented primer layer may completely cover the matte sealant layer and be completely covered by the bonder layer. A hardening layer and an anti-oxidant layer may completely cover the photopolymer layer.

The invention also includes a method for manufacturing the previously described seamless, trilaminate, photopolymer cylindrical printing plate. Such manufacture is accomplished by providing a cylindrical mandrel with an outer wall; applying a seamless trilaminate cylindrical sleeve to completely cover the outer wall of the mandrel and to form a first structure; allowing the first structure to cure; subjecting the first structure to a post-cure; cleaning the surface of the seamless trilaminate cylindrical sleeve; spraying a matte sealant layer to completely cover the surface of the seamless trilaminate cylindrical sleeve; allowing the matte sealant layer to dry to form a second structure; spraying a bonder layer to completely cover the surface of the second structure; spraying a photopolymer layer to completely cover the bonder layer and to form a third structure; curing the third structure; polishing the photopolymer layer surface of the third structure to the desired outside diameter and surface finish; applying a hardening layer to completely cover the photopolymer layer; applying an anti-oxidant layer to completely cover the hardening layer; and processing the completed structure for printing use.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing, in which.

DETAILED DESCRIPTION OF THE INVENTION

Figure 1:
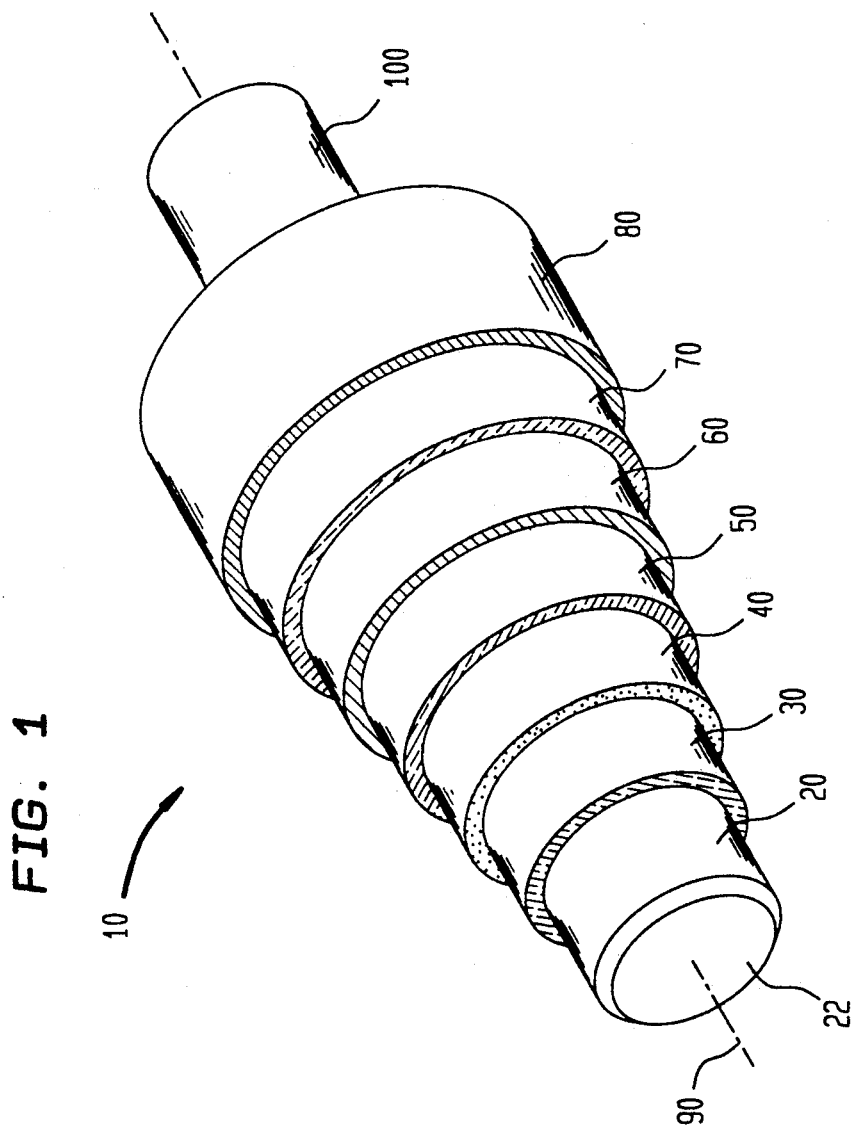
FIG. 1 is a perspective, cut-away view of a seamless, trilaminate, photopolymer, cylindrical printing plate manufactured according to the present invention.
Figure 2:
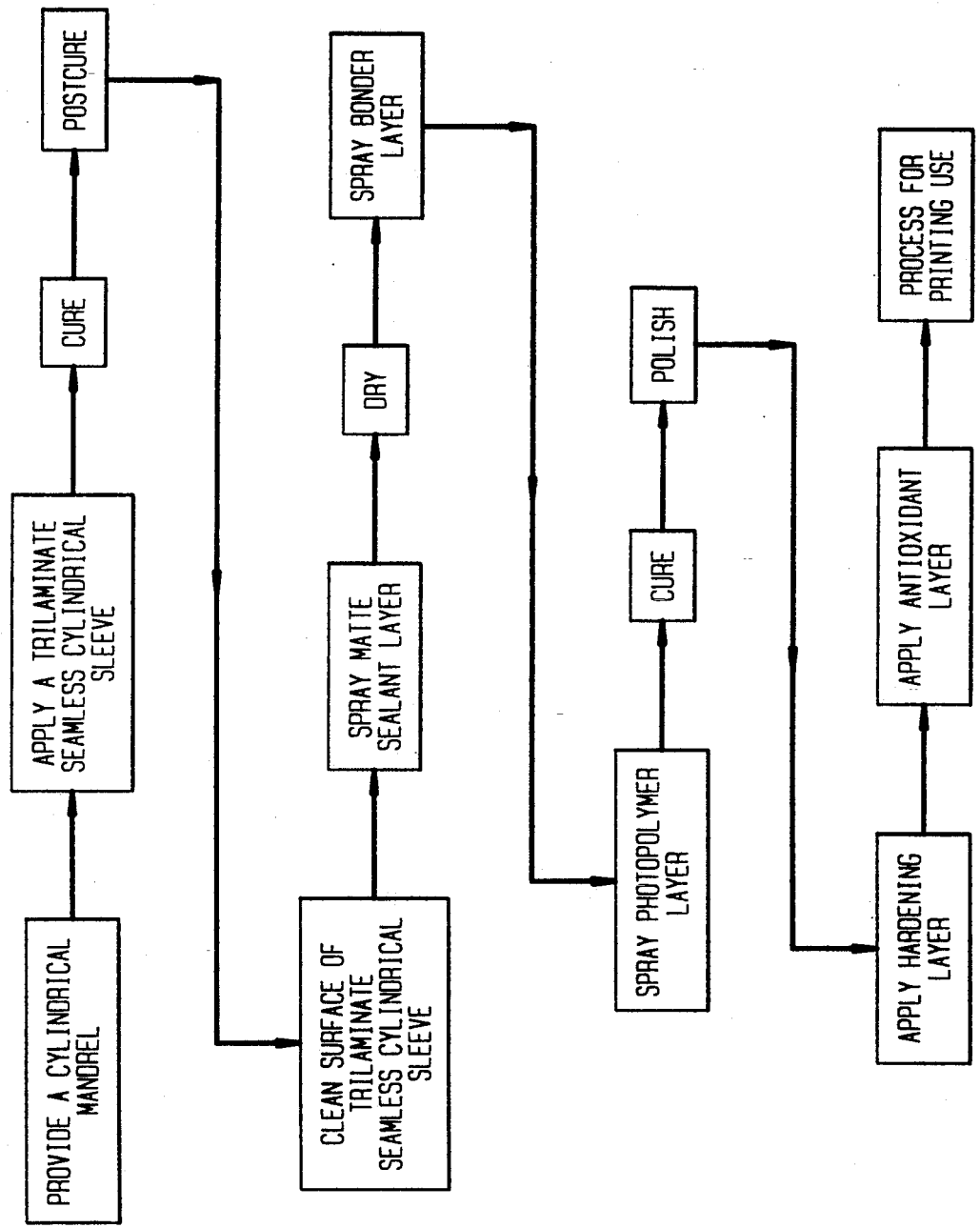
FIG. 2 is a schematic diagram of preferred steps in the process of the present invention for manufacturing the seamless, trilaminate, photopolymer cylindrical printing plate shown in FIG. 1.

Referring now FIGS. 1 and 2, the seamless, trilaminate, photopolymer cylindrical printing plate 10 of the present invention includes as its base a seamless trilaminate cylindrical sleeve 20. Seamless trilaminate cylindrical sleeve 20 defines a hollow inner chamber 22 which has a constant diameter and which is sized to fit firmly and frictionally on a given printing cylinder (not shown).

Seamless trilaminate cylindrical sleeve 20 has a reinforced, non-permeable structure of three laminated layers. First, a synthetic resin liner is provided to form a unitary, airtight sleeve body. The liner may be composed of polyester, such as Derakane ® (a vinyl ester resin manufactured by the Dow Chemical Company). When cured, the resin liner must be tough, resist impact and chemical attack, and have a high tensile strength.

An internal reinforcing layer of high-strength synthetic or organic fibers is then applied about the resin layer. The reinforcing layer must have high strength and be light-weight. A single layer of a woven composite of synthetic fibers, such as aramid fibers manufactured by DuPont under the registered trademark Kevlar ®, is suitable. Alternatively, woven fiberglass filaments formed as a composite boat cloth fabric can be used to reinforce and add rigidity to the resin layer.

Finally, a coating of a non-permeable material, such as a non-woven, non-apertured synthetic material, is applied around the reinforcing layer. The coating layer may be a vinyl ester resin. A polyester non-woven polymeric web, such as Nexus ®, manufactured by Burlington Industries, is suitable. The coating layer gives the seamless trilaminate cylindrical sleeve 20 machineability and shock resistance and, when saturated with resin, provides a fluid-tight barrier and a seamless surface. The amount of coating layer applied can be varied as a function of the desired wall thickness (typically between 0.020 and 0.200 inches) of the trilaminate seamless cylindrical sleeve 20.

A suitable seamless trilaminate cylindrical sleeve 20 is disclosed in U.S. Pat. No. 4,903,597 issued to Hoage et al., incorporated herein by reference. One advantage of seamless trilaminate cylindrical sleeve 20 is that it can be both air mounted and used with conventional hydraulic or mechanical press cylinders. Another advantage is that the wall thickness of seamless trilaminate cylindrical sleeve 20 can be varied as desired to achieve various cylindrical repeat sizes. Still another advantage is that it can be coated with a photopolymerizable composition, as discussed below.

Over seamless trilaminate cylindrical sleeve 20 is sprayed a clear matte sealant layer 30 to achieve a coating thickness of about 0.001 to 0.002 inches. Matte sealant layer 30 is a two-component gloss polyurethane material. The clear topcoat marketed by The Sherwin-Williams Company as the F63 V 1 product under the trademark Polane ® is suitable. A catalyst is added to the two-component glass polyurethane material for proper use of matte sealant layer 30. The catalyst may be Polane ® Catalyst V66 V29. A typical formula for the material of matte sealant layer 30 is seven parts by volume F63 V 1 and one part by volume V66 V29. The drying time of matte sealant layer 30 may be reduced by adding a small amount of an accelerator such as Polane ® V66 V B11. One ounce of V66 V B11 per gallon of F63 V 1 is a suitable amount.

Matte sealant layer 30 has excellent hardness and impact resistance; may be applied with various spray equipment; and adheres well to, and may be flatted to diminish the gloss on, the surface of seamless trilaminate cylindrical sleeve 20.

A pigmented primer layer 40 may then be applied to matte sealant layer 30. Pigmented primer layer 40 is optional and, if applied, is sprayed onto matte sealant layer 30 as a single, thin coat (no thicker than necessary to achieve a uniform coat). A suitable material for pigmented primer layer 40 is Krylon ® white spray primer made by DuPont. Pigmented primer layer 40 increases the surface diffusivity and reflectivity of seamless, trilaminate, photopolymer cylindrical printing plate 10, thereby increasing the scatter of light impinging on the surface of seamless, trilaminate, photopolymer cylindrical printing plate 10. The increased light scatter promotes shoulder formation in the relief areas of seamless, trilaminate, photopolymer cylindrical printing plate 10. Primer layer 40 must resist baking temperatures and alcohols and other solvents which will be encountered, and it must provide a secure and durable bond between seamless trilaminate cylindrical sleeve 20 and subsequent layers.

A bonder layer 50 is then air sprayed onto pigmented primer layer 40, if used, or directly onto matte sealant layer 30. Bonder layer 50 is a resin material which is photosensitive. When ultraviolet or actinic light irradiates bonder layer 50, bonder layer 50 is activated or polymerized. Bonder layer 50 promotes adhesion on the surface of pigmented primer layer 40 and, like primer layer 40, helps to provide a secure and durable bond between seamless trilaminate cylindrical sleeve 20 and subsequent layers.

Next, a seamless coating of a high molecular weight photopolymer layer 60 is applied over bonder layer 50. The preferred thickness of photopolymer layer 60 is 0.025 inches. The thickness can be etched down to 0.015 inches for the relief of image areas, leaving approximately 0.010 inches of unetched, uniform base to strengthen the structure of seamless, trilaminate, photopolymer cylindrical printing plate 10. In essence, the relief areas or image areas which receive ink are joined with a uniform layer of photopolymer material. When post-exposed and baked, that material gives the image area greater strength than it would have if the image area were etched completely down to the base.

The ultimate wall thickness of seamless, trilaminate, photopolymer cylindrical printing plate 10 can be varied to achieve any desired size. Variations can be controlled, as mentioned above, by modifying the thickness of seamless trilaminate sleeve 20. They can also be controlled by modifying the thickness of photopolymer layer 60.

Photopolymer layer 60 is a mixture of about 70–95%, by weight, of an alcohol-soluble linear polyamide; about 0.5–15%, by weight, of a low molecular weight dicarboxylic acid diester; and an effective amount of at least one photosensitizer and at least one polymerization inhibitor. A suitable material is disclosed in U.S. Pat. No. 4,269,930 issued to Kress, incorporated herein by reference.

The polyamide component of photopolymer layer 60 may be any polyamide conventionally used in photopolymer compositions. These include copolyamides which are soluble in common solvents, such as lower aliphatic alcohols or mixtures of these alcohols with water, ketones, or aromatic compounds. Particularly suitable linear polyamides are described in U.S. Pat. No. 4,144,073; No. 3,516,828; and No. 3,512,971.

The appropriate "low molecular weight dicarboxylic acid diester" is a saturated and unsaturated dicarboxylic acid diester having up to eight carbon atoms in the acid backbone and up to four carbon atoms in the alcohol moiety appended at the ester linkage. Preferred diesters include diethyl malonate, diethyl fumarate, diethyl sebacate, diproply adipate, and diethyl maleate. The most preferred diester components are those with short acid backbones, such as diethyl malonate, diethyl fumarate, and diethyl maleate.

Suitable photosensitizers are compounds which decompose to radicals upon exposure to light or irradiation and initiate polymerization. Such compounds are well known to persons of skill in the art and include acyloins and their derivatives, such as benzoin, benzoin alkyl ethers, alpha-methylolbenzoin and its ethers, alpha-methylbenzoin, diketones and their derivatives, monoketals, and substituted and unsubstituted quinones, such as anthraquinone. Other photosensitizers may suffice, including inorganic materials such as potassium dichromate. Generally, the amount of photosensitizer in photopolymer layer 60 is between 0.01–5% by weight.

Similarly, suitable polymerization inhibitors are any of the conventional inhibitors used to prevent thermal polymerization. These include methylene blue, hydroquinone, p-methoxyphenol, and the like. Generally, the amount of polymerization inhibitor in photopolymer layer 60 is between 0.01–2% by weight.

Seamless, trilaminate, photopolymer cylindrical printing plate 10 with photopolymer layer 60 is tough, hard, durable, accurate, and versatile. The strength and hardness can be improved even further, when necessary for a specific printing application, by applying a hardening layer 70. Tertiary amines with ultraviolet photosensitive sensitizers provide a suitable hardening layer 70. Similarly, an anti-oxidant layer 80 may be provided to prevent oxidation of photopolymer layer 60.

In manufacturing seamless, trilaminate, photopolymer cylindrical printing plate 10, a support base or mandrel 100 is used. Typically, mandrel 100 is made of metal (such as steel), which can act as a heat sink, and is cylindrical in shape. The diameter of the outer wall of mandrel 100 is sized to produce a seamless, trilaminate, photopolymer cylindrical printing plate 10 having an inner wall surface defining a hollow chamber 22 of substantially constant diameter and a magnitude slightly smaller than the diameter of the outer wall of the printing cylinder on which seamless, trilaminate, photopolymer cylindrical printing plate 10 will ultimately be mounted. Thus, an interference fit between seamless, trilaminate, photopolymer cylindrical printing plate 10 and the printing cylinder is assured.

A mold-release agent, such as polyvinyl alcohol, may be applied to completely cover the outer wall of mandrel 100 to facilitate removal of seamless, trilaminate, photopolymer cylindrical printing plate 10 from mandrel 100 when processing is complete.

Next, seamless trilaminate cylindrical sleeve 20 is applied to the outer wall of mandrel 100. The synthetic resin layer of seamless trilaminate cylindrical sleeve 20 is applied directly to mandrel 100. An internal reinforcing layer is then applied about the resin layer. Finally, at least one layer of a nonpermeable material is applied (preferably wrapped) about the reinforcing layer. Although the inside diameter of seamless trilaminate cylindrical sleeve 20 is fixed by the dimensions of hollow chamber 22, a variety of wall thicknesses can be achieved for seamless trilaminate cylindrical sleeve 20.

With seamless trilaminate cylindrical sleeve 20 in place, the structure is allowed to cure for a time sufficient to allow the resin to cure, cross-link, and dimensionally stabilize. Typically, the process of curing is done under exothermic conditions for about two hours. During the process, the mandril is rotated about longitudinal axis 90 of seamless, trilaminate, photopolymer cylindrical printing plate 10.

Seamless trilaminate cylindrical sleeve 20 is then post-cured for a period of time at an elevated temperature. Typically, the post-cure is conducted for thirty minutes at a temperature of 170° F in a post-cure oven. Seamless trilaminate cylindrical sleeve 20 is then removed from the oven and allowed to cool to ambient temperature.

The surface of seamless trilaminate cylindrical sleeve 20 must be free of dirt, grease, fingerprints, and other foreign matter before subsequent layers are applied. Accordingly, the surface is cleaned before matte sealant layer 30 is applied (preferably by spraying) as mandrel 100 is rotated in an enclosed, heated chamber. Once matte sealant layer 30 is applied, completely covering seamless trilaminate cylindrical sleeve 20, the structure is allowed to dry. Preferably, the structure is air dried overnight. It can be force dried for 30–90 minutes at 140–225° F. The drying time of the structure can also be accelerated by adding an accelerator to the sealant material before matte sealant layer 30 is applied.

Pigmented primer layer 40 may (optionally) be sprayed onto matte sealant layer 30. If applied, pigmented primer layer 40 is sprayed evenly over the entire surface of matte sealant layer 30 using either an air or airless spray gun and then baked dry. Other spraying and coating techniques may be used. The goal is a smooth, even coat without trapped gas to cause imperfections.

Using a similar coating technique, a bonder layer 50 is then sprayed onto pigmented primer layer 40, if used, or directly onto matte sealant layer 30. In either case, bonder layer 50 completely covers pigmented primer layer 40 or matte sealant layer 30.

Next, photopolymer layer 60 is applied to completely cover bonder layer 50. The photopolymer composition is dissolved into a lower aliphatic alcohol, preferably n-propanol, to allow the composition to flow as a liquid. The alcohol acts as a diluent or carrier which permits photopolymer layer 60 to be sprayed onto bonder layer 50 as an even coat using conventional spray techniques. Photopolymer layer 60 is applied in an enclosed, heated chamber as mandrel 100 is rotated. A single, air-assisted spray nozzle, which traverses the longitudinal axis 90 of seamless, trilaminate, photopolymer cylindrical printing plate 10, suffices to apply photopolymer layer 60.

The preferred thickness of photopolymer layer 60 depends upon the type of printing to be done. Gravure printing may require, for example, a deposition rate of about one milliliter per square inch. Letter press printing would require a thicker coating, built up in even layers to any desired thickness. The coating thickness is a function of the viscosity, the amount (volume), the composition, and the feed rate of the sprayed liquid photopolymer material.

After photopolymer layer 60 is applied, the structure is cured at a given temperature (e.g., 150° F.) by convection heat for a period sufficient to eliminate solvent materials (i.e., to evaporate the alcohol) and to degas the photopolymer layer 60 and bonder layer 50. The result is a dry coating of photopolymer layer 60. The surface of seamless, trilaminate, photopolymer cylindrical printing plate 10 should be hard, glossy smooth, and within dimensional tolerances. The surface of photopolymer layer 60 is polished, therefore, to the desired outside diameter and surface finish. The surface can be made especially hard by coating it completely with hardening layer 70. An anti-oxidant layer 80 can be applied for protection.

Thereafter, seamless, trilaminate, photopolymer cylindrical printing plate 10 is post-processed for printing use. Seamless, trilaminate, photopolymer cylindrical printing plate 10 is imaged and etched by the same general methods already used in the art. Seamless, trilaminate, photopolymer cylindrical printing plate 10 can be exposed via "direct laser imaging," for example, by matching the spectral sensitivity of the sensitizers and polymerization inhibitors used in photopolymer layer 60 with the spectral emission of the laser (and the corresponding quartz optical components) used.

Seamless, trilaminate, photopolymer cylindrical printing plate 10 can also be mounted on a "laydown" exposure machine (horizontal or vertical). The negative component mounted on the laydown machine contains the pattern to be exposed onto seamless, trilaminate, photopolymer cylindrical printing plate 10. (When seamless, trilaminate, photopolymer cylindrical printing plate 10 is to be used in an intaglio or a gravure printing application, the intermediate photographic exposure medium is in positive form.)

The photographic negative exposure medium and seamless, trilaminate, photopolymer cylindrical printing plate 10 are brought into intimate contact. Actinic light passing through the photographic negative exposure medium polymerizes portions of the surface of seamless, trilaminate, photopolymer cylindrical printing plate 10 in the pattern of the image used. These polymerized portions become the ink-receptive or image areas of the final seamless, trilaminate, photopolymer cylindrical printing plate 10.

The opaque areas of the negative medium attenuate or block the actinic radiation. Thus, the areas of seamless, trilaminate, photopolymer cylindrical printing plate 10 in contact with those opaque areas do not polymerize; instead, they are removed by a washing or etching fluid formed as a mixture of water and a lower aliphatic alcohol (such as ethanol).

After washing or etching, seamless, trilaminate, photopolymer cylindrical printing plate 10 is preferably spray coated with a thin layer of a fluorotelomer. The fluorotelomer coating provides the surface finish required for optimum surface tension between ink and seamless, trilaminate, photopolymer cylindrical printing plate 10, improving wear resistance and ink release. Such a finish is especially desirable for intaglio printing because a smooth surface with low friction wears well against the doctor blade used in such printing. A suitable fluorotelomer material is marketed by DuPont under the brand name Vydax 550.

Convection baking may also be done to increase the hardness of the washed or etched seamless, trilaminate, photopolymer cylindrical printing plate 10. The preferred baking step, performed with or without a fluorotelomer coating, can be done directly in a conventional oven at temperatures between 350° F. and 550° F. (450° F. to 500° F. is best).

However used, when fully polymerized, hardened, and baked, seamless, trilaminate, photopolymer cylindrical printing plate 10 forms a tough, durable, and strong structure able to resist wear, abrasion, delamination, solvent erosion, acids, and alcohols. The useful life of seamless, trilaminate, photopolymer cylindrical printing plate 10 is significantly longer than the life of conventional cylindrical printing plates. By comparison and for example, the useful life of seamless, trilaminate, photopolymer cylindrical printing plate 10 is three and one-half times longer when printing by letter press and five times longer when printing by dry-offset.

Moreover, the strength of the overall relief images is increased. The combination of a 0.010-inch photopolymer layer 60 with a 0.015-inch image relief area forms a seamless, trilaminate, photopolymer cylindrical printing plate 10 of very high strength having a useful life of between two and five million impressions with minimum dot or fine-line degradation. Seamless, trilaminate, photopolymer cylindrical printing plate 10 is impervious to alcohols, solvents, and additives used in resin-oil-based, water-based, and solvent-based inks and press wash-up materials.

Seamless, trilaminate, photopolymer cylindrical printing plate 10 is versatile. It can be air mounted on air-mount print cylinders, air mounted on conventional print cylinders with "slave collars," or mounted on hydraulic or mechanical print cylinders used in conjunction with printing presses and press proofers. It can be manufactured at different repeat sizes. And it can be used to print high-quality, continuous images through flexographic, letter press, dry-offset, intaglio, gravure, and other processes.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A seamless, trilaminate, photopolymer cylindrical printing plate useful in a variety of printing processes, including the flexographic, letter press, dry-offset, intaglio, and gravure processes, capable of millions of printing runs with minimal degradation, said seamless, trilaminate, photopolymer cylindrical printing plate having any desired thickness and comprising:
   a seamless trilaminate cylindrical sleeve having a constant cross-sectional diameter and a longitudinal axis;
   a clear matte sealant layer completely covering said seamless trilaminate cylindrical sleeve;
   a bonder layer completely covering said clear matte sealant layer; and
   a photopolymer layer completely covering said bonder layer.

2. A seamless, trilaminate, photopolymer cylindrical printing plate as claimed in claim 1 wherein said seamless trilaminate cylindrical sleeve has a reinforced, non-permeable structure of three laminated layers:
   (a) a synthetic resin liner forming a unitary, airtight body;
   (b) an internal reinforcing layer of high-strength fibers; and
   (c) a coating of a non-permeable material.

3. A seamless, trilaminate, photopolymer cylindrical printing plate as claimed in claim 1 wherein said clear matte sealant layer is a two-component gloss polyurethane.

4. A seamless, trilaminate, photopolymer cylindrical printing plate as claimed in claim 1 further comprising a pigmented primer layer completely covering said matte sealant layer and completely covered by said bonder layer.

5. A seamless, trilaminate, photopolymer cylindrical printing plate as claimed in claim 4 wherein said bonder layer is a photosensitive resin for promoting adhesion to said pigmented primer layer.

6. A seamless, trilaminate, photopolymer cylindrical printing plate as claimed in claim 1 wherein photopolymer layer is a high molecular weight photopolymer having an applied thickness of about 0.025 inches.

7. A seamless, trilaminate, photopolymer cylindrical printing plate as claimed in claim 6 wherein said photopolymer layer is a mixture of:
   (a) about 70-95%, by weight, of an alcohol-soluble linear polyamide;
   (b) about 0.5-15%, by weight, of a low molecular weight dicarboxylic acid diester; and
   (c) an effective amount of at least one photosensitizer and at least one polymerization inhibitor.

8. A seamless, trilaminate, photopolymer cylindrical printing plate as claimed in claim 7 wherein the spectral sensitivity of said photopolymer layer is adapted for excitation by the spectral emission of the laser which will be used to photopolymerize said seamless, trilaminate, photopolymer cylindrical printing plate by direct laser imaging.

9. A seamless, trilaminate, photopolymer cylindrical printing plate as claimed in claim 1 further comprising a hardening layer completely covering said photopolymer layer.

10. A seamless, trilaminate, photopolymer cylindrical printing plate as claimed in claim 9 wherein said hardening layer is a tertiary amine with ultraviolet photosensitive sensitizers.

11. A seamless, trilaminate, photopolymer cylindrical printing plate as claimed in claim 9 further comprising an anti-oxidant layer completely covering said hardening layer.

12. A method of manufacturing a seamless, trilaminate, photopolymer cylindrical printing plate useful in a variety of printing processes, including the flexographic, letter press, dry-offset, intaglio, and gravure processes, and capable of millions of printing runs with minimal degradation, said method comprising the steps of:
   (a) providing a cylindrical mandrel with an outer wall;
   (b) applying a seamless trilaminate cylindrical sleeve to completely cover the outer wall of the mandrel and to form a first structure having any desired thickness;
   (c) allowing the first structure to cure;
   (d) subjecting the first structure to a postcure;
   (e) cleaning the surface of the seamless trilaminate cylindrical sleeve;
   (f) spraying a matte sealant layer to completely cover the surface of the seamless trilaminate cylindrical sleeve;
   (g) allowing the matte sealant layer to dry to form a second structure;
   (h) spraying a bonder layer to a completely cover the surface of the second structure;
   (i) spraying a photopolymer layer to completely cover the bonder layer and to form a third structure having any desired thickness;
   (j) curing the third structure; and
   (k) processing the third structure for printing use.

13. A method of manufacturing a seamless, trilaminate, photopolymer cylindrical printing plate as claimed in claim 12 wherein the outer wall of said mandrel is sized to produce a seamless, trilaminate, photopolymer cylindrical printing plate having an inner wall surface defining a hollow chamber of substantially constant diameter and a magnitude slightly smaller than the diameter of the outer wall of the printing cylinder on which the seamless, trilaminate, photopolymer cylindrical printing plate will ultimately be mounted.

14. A method of manufacturing a seamless, trilaminate, photopolymer cylindrical printing plate as claimed in claim 12 further comprising, before the step of applying a seamless trilaminate cylindrical sleeve, applying a mold-release agent to the outer wall of the mandrel to facilitate removal of the seamless, trilaminate, photopolymer cylindrical printing plate from the mandrel when processing is complete.

15. A method of manufacturing a seamless, trilaminate, photopolymer cylindrical printing plate as claimed in claim 12 wherein said step of applying a seamless trilaminate cylindrical sleeve to the outer wall of the mandrel includes:
   applying a synthetic resin layer directly to the mandrel;
   applying an internal reinforcing layer about the resin layer; and wrapping at least one layer of non-permeable material about the internal reinforcing layer.

16. A method of manufacturing a seamless, trilaminate, photopolymer cylindrical printing plate as claimed in claim 12 wherein the post-cure step includes placing the first structure in an oven at 170° F. for thirty minutes, then removing the first structure from the oven and allowing it to cool to ambient temperature.

17. A method of manufacturing a seamless, trilaminate, photopolymer cylindrical printing plate as claimed in claim 12 wherein the step of spraying a matte sealant layer on the surface of the seamless trilaminate cylindrical sleeve is done while the mandrel is rotated in an enclosed, heated chamber.

18. A method of manufacturing a seamless, trilaminate, photopolymer cylindrical printing plate as claimed in claim 12 further comprising the step, after allowing the matte sealant layer to dry to form a second structure and before spraying a bonder layer to completely cover the surface of the second structure, of spraying a pigmented primer layer to completely cover the surface of the matte sealant layer.

19. A method of manufacturing a seamless, trilaminate, photopolymer cylindrical printing plate as claimed in claim 12 further comprising, before the step of spraying a photopolymer layer to completely cover the bonder layer, dissolving the photopolymer into a lower aliphatic alcohol to form a liquid.

20. A method of manufacturing a seamless, trilaminate, photopolymer cylindrical printing plate as claimed in claim 12 wherein the step of spraying a photopolymer layer to completely cover the bonder layer is done in an enclosed, heated chamber as the mandrel is rotated.

21. A method of manufacturing a seamless, trilaminate, photopolymer cylindrical printing plate as claimed in claim 12 wherein the step of curing the third structure is done at about 150° F. by convection heat.

22. A method of manufacturing a seamless, trilaminate, photopolymer cylindrical printing plate as claimed in claim 12 further comprising, after the step of curing the third structure and before the step of processing the third structure for printing use, polishing the photopolymer layer surface of the third structure to the desired outside diameter and surface finish.

23. A method of manufacturing a seamless, trilaminate, photopolymer cylindrical printing plate as claimed in claim 12 further comprising, after the step of curing the third structure and before the step of processing the third structure for printing use, applying a hardening layer to completely cover the photopolymer layer.

24. A method of manufacturing a seamless, trilaminate, photopolymer cylindrical printing plate as claimed in claim 23 further comprising, after the step of applying a hardening layer and before the step of processing the third structure for printing use, applying an anti-oxidant layer to completely cover the hardening layer.

25. A method of manufacturing a seamless, trilaminate, photopolymer cylindrical printing plate as claimed in claim 12 further comprising, after the step of curing the third structure and before the step of processing the third structure for printing use, applying an anti-oxidant layer to completely cover the photopolymer layer.

* * * * *